(12) United States Patent
Chen et al.

(10) Patent No.: US 7,482,227 B1
(45) Date of Patent: Jan. 27, 2009

(54) METHOD FOR MANUFACTURING A FLASH MEMORY

(75) Inventors: Mao-Quan Chen, Changhua County (TW); Ching-Nan Hsiao, Kaohsiung County (TW); Chung-Lin Huang, Tao-Yuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 3 days.

(21) Appl. No.: 11/863,282

(22) Filed: Sep. 28, 2007

(30) Foreign Application Priority Data

Jul. 3, 2007 (TW) .............................. 96124148 A

(51) Int. Cl.
*H01L 21/8247* (2006.01)
(52) U.S. Cl. ................. 438/257; 438/589; 257/E21.179
(58) Field of Classification Search ......... 438/257–267, 438/589; 257/E21.179
See application file for complete search history.

(56) References Cited

U.S. PATENT DOCUMENTS

| 7,341,913 | B2 * | 3/2008 | Wang | 438/257 |
| 2003/0119256 | A1 * | 6/2003 | Dong et al. | 438/257 |
| 2006/0205151 | A1 * | 9/2006 | Lee | 438/257 |
| 2006/0223263 | A1 * | 10/2006 | Hu | 438/257 |
| 2007/0134877 | A1 * | 6/2007 | Hyun | 438/263 |
| 2007/0138537 | A1 * | 6/2007 | Park | 257/315 |

* cited by examiner

*Primary Examiner*—Richard A. Booth
(74) *Attorney, Agent, or Firm*—Winston Hsu

(57) ABSTRACT

A method for manufacturing a flash memory includes providing a substrate with a sacrificial oxide layer, a sacrificial poly-Si layer, a hard mask layer and a trench exposing part of the substrate and filled with an oxide layer, later depositing a oxide layer conformally on the sacrificial oxide layer and the oxide layer, and afterwards removing the oxide layer on the sacrificial oxide layer and on the top of the oxide layer and the sacrificial oxide layer to form a spacer as a STI oxide spacer.

9 Claims, 9 Drawing Sheets

METHOD FOR MANUFACTURING A FLASH MEMORY

BACKGROUND OF THE INVENTION

1. Field of the Invention

The present invention relates to a method for manufacturing a flash memory, and more particularly, to a method for manufacturing a flash memory by using a spacer as an STI oxide spacer.

2. Description of the Prior Art

The flash memory is widely used because of its capability of non-volatile information storage. Generally speaking, the flash memory is divided into two groups, the NOR flash memory and the NAND flash memory.

In the production of the NAND flash memory, a shallow trench isolation (STI) is usually formed by a dry etching and later the location and the shape of the poly-Si of the floating gate are defined by the STI.

However, as shown in FIG. 1, the profile of the trench formed by the dry etching must be in a shape of an "inverted trapezoid" when the STI 120 is formed by dry etching the substrate 110 and filling with an isolation material. Accordingly, the chosen location of the floating gate 130 must be in the shape of a trapezoid and have poly-Si remained therein, which will affect the isolation as well as allocation of each individual floating gate, such as bits independence and distribution and cause confusion and error of data access, such as data storage shortage.

Therefore, a novel method is needed for manufacturing the flash memory, which is capable of amending the flawed profile of the STI oxide to solve the problem.

SUMMARY OF THE INVENTION

The present invention provides a method for manufacturing a flash memory by taking the advantages of forming a spacer on the sidewall of the STI oxide spacer as the STI oxide spacer to amend the flawed profile of the STI oxide to solve the problem in the prior art, such as bits independence and distribution or data storage shortage.

The method for manufacturing a flash memory of the present invention includes first providing a substrate with a sacrificial oxide layer, a sacrificial poly-Si layer, a first hard mask layer and a first trench exposing part of the substrate in sequence; filling the first trench with a first oxide layer; later removing the first hard mask layer and the sacrificial poly-Si layer to form a second trench and expose the sacrificial oxide layer; afterwards depositing a oxide layer conformally on the sacrificial oxide layer and on the first oxide layer; then removing the oxide layer on the sacrificial oxide layer and on the top of the first oxide layer, and the sacrificial oxide layer to form a spacer as an STI oxide spacer surrounding the first oxide layer to allow the spacer to engage with the substrate and to allow the second trench to have an inverted trapezoidal shape and expose the substrate; later forming a floating gate oxide on the substrate, filling the second trench with the floating gate poly-Si layer and forming a second hard mask layer on the top of the first oxide layer and on the floating gate poly-Si layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

In FIG. 2 first a sacrificial oxide layer, an oxide layer and a trench is formed.

In FIG. 3 the trench is filled with a first oxide layer.

In FIG. 4 the sacrificial oxide layer and the oxide layer is removed.

In FIG. 5 an oxide layer is conformally deposited on the sacrificial oxide layer and the oxide layer.

In FIG. 6 a spacer as a STI oxide spacer is formed.

FIG. 7 to FIG. 9 illustrate the method for manufacturing the flash memory of the present invention.

DETAILED DESCRIPTION

In the method for manufacturing a flash memory of the present invention after the STI oxide is formed, a pair of spacers is formed on the sidewall of the STI oxide spacer. Such spacer may amend the inverted trapezoid to a trapezoid, which corrects the flawed profile of the STI oxide and solves the problem of remaining poly-Si.

Figure 1:
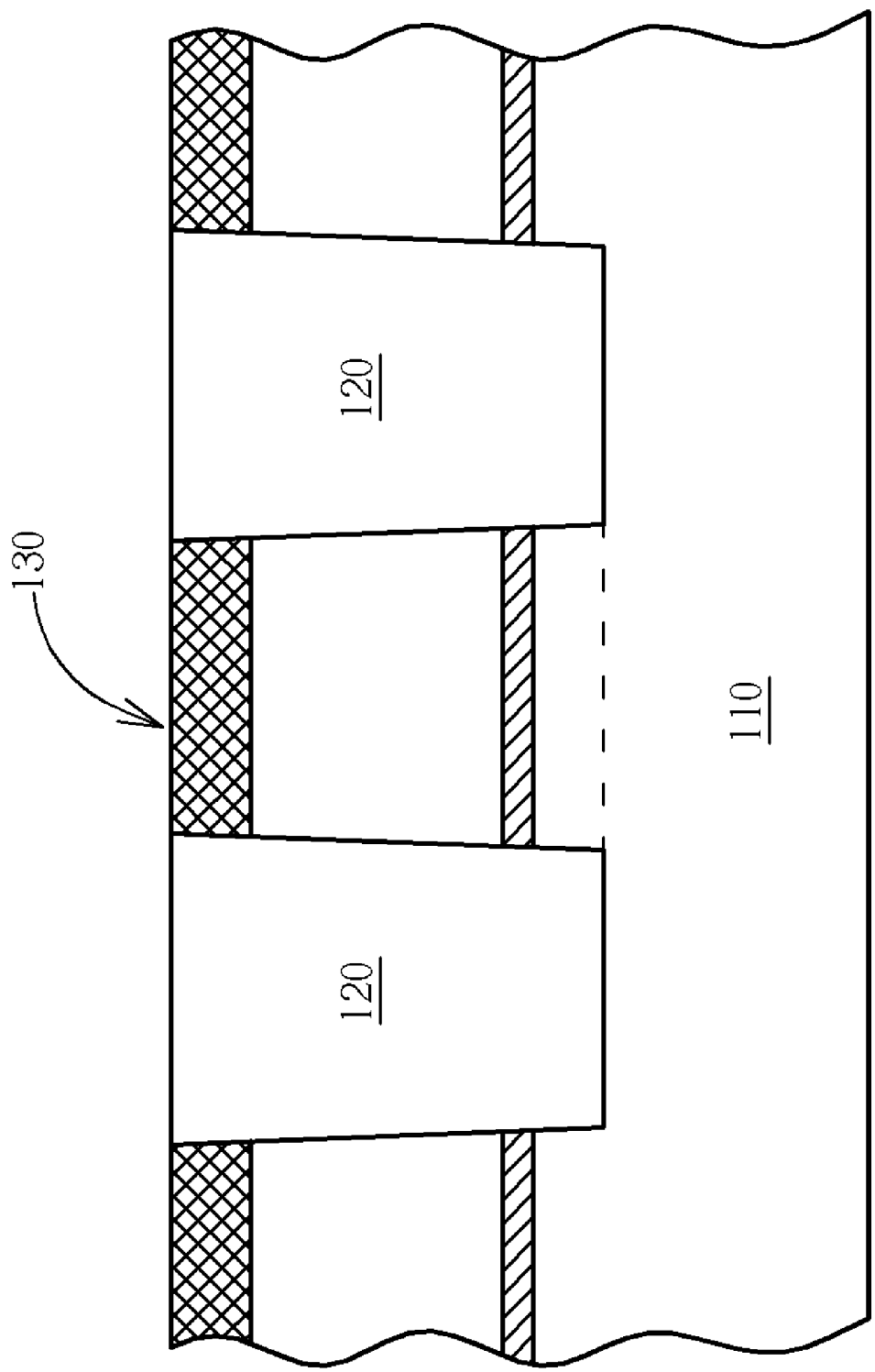
FIG. 1 illustrates the flawed profile of the "inverted trapezoid" trench formed by the dry etching.
Figure 2:
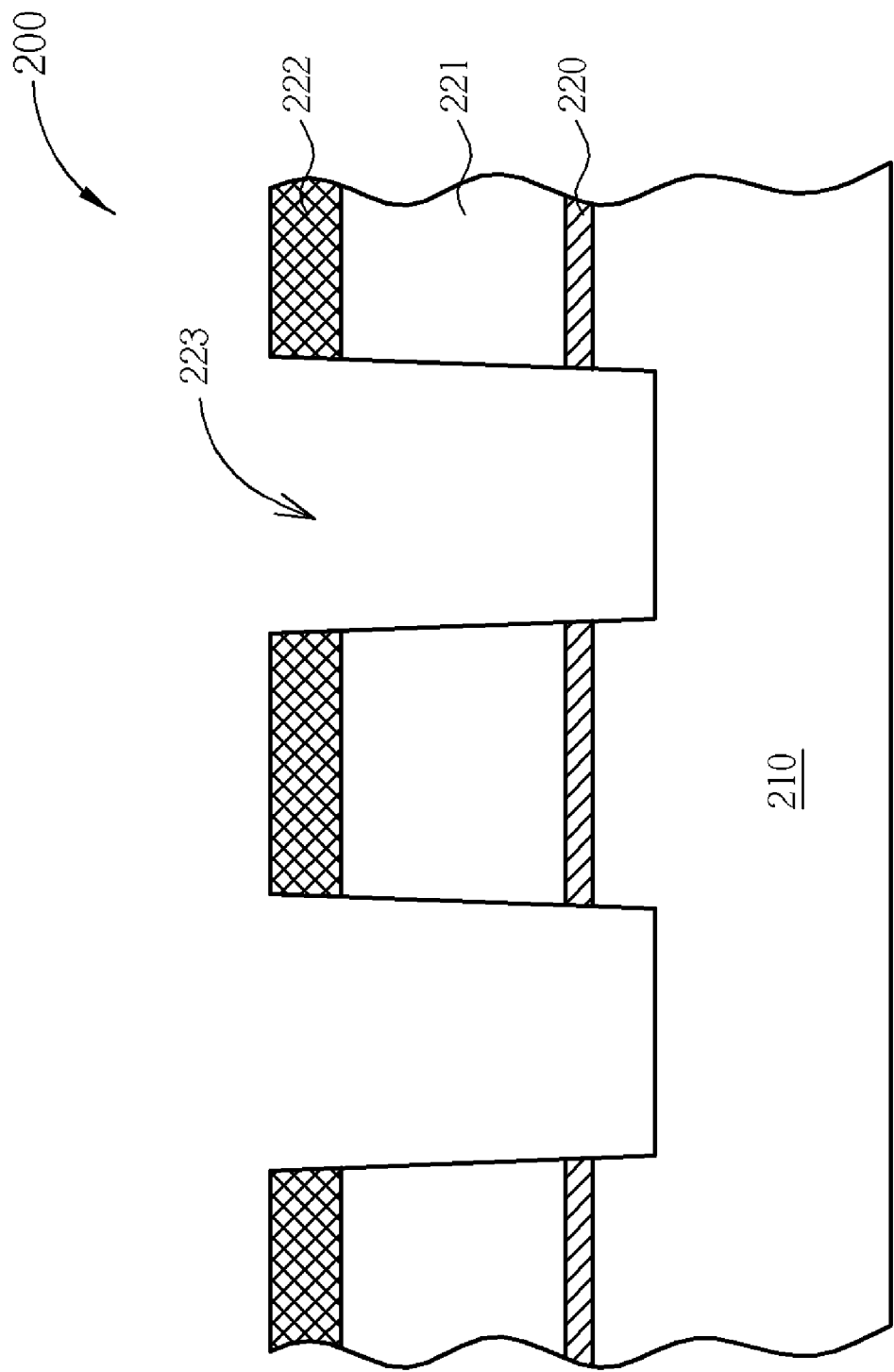
FIG. 2 to FIG. 9 illustrate the method for manufacturing the flash memory of the present invention.

FIG. 2 to FIG. 9 illustrate the method for manufacturing the flash memory 200 of the present invention. First as shown in FIG. 2, a substrate 210 is provided with a sacrificial oxide layer 220, a sacrificial poly-Si layer 221, a first hard mask layer 222 and a first trench 223 exposing part of the substrate 210 formed on and/or defined in the substrate 210 in sequence.

The substrate 210 is usually a semiconductor substrate, such as Si. The thickness of the sacrificial poly-Si layer 221 is about 1500 Å-1800 Å, and preferably the sacrificial poly-Si layer 221 includes undoped poly-Si. The first hard mask layer 222 usually includes a silicon nitride material. The first trench 223 may be formed by dry etching to be as deep as about 1800 Å-2600 Å in the substrate to define the STI. The profile of the first trench 223 should be in a shape of an "inverted trapezoid" due to the characteristic of the dry etching.

Figure 3:
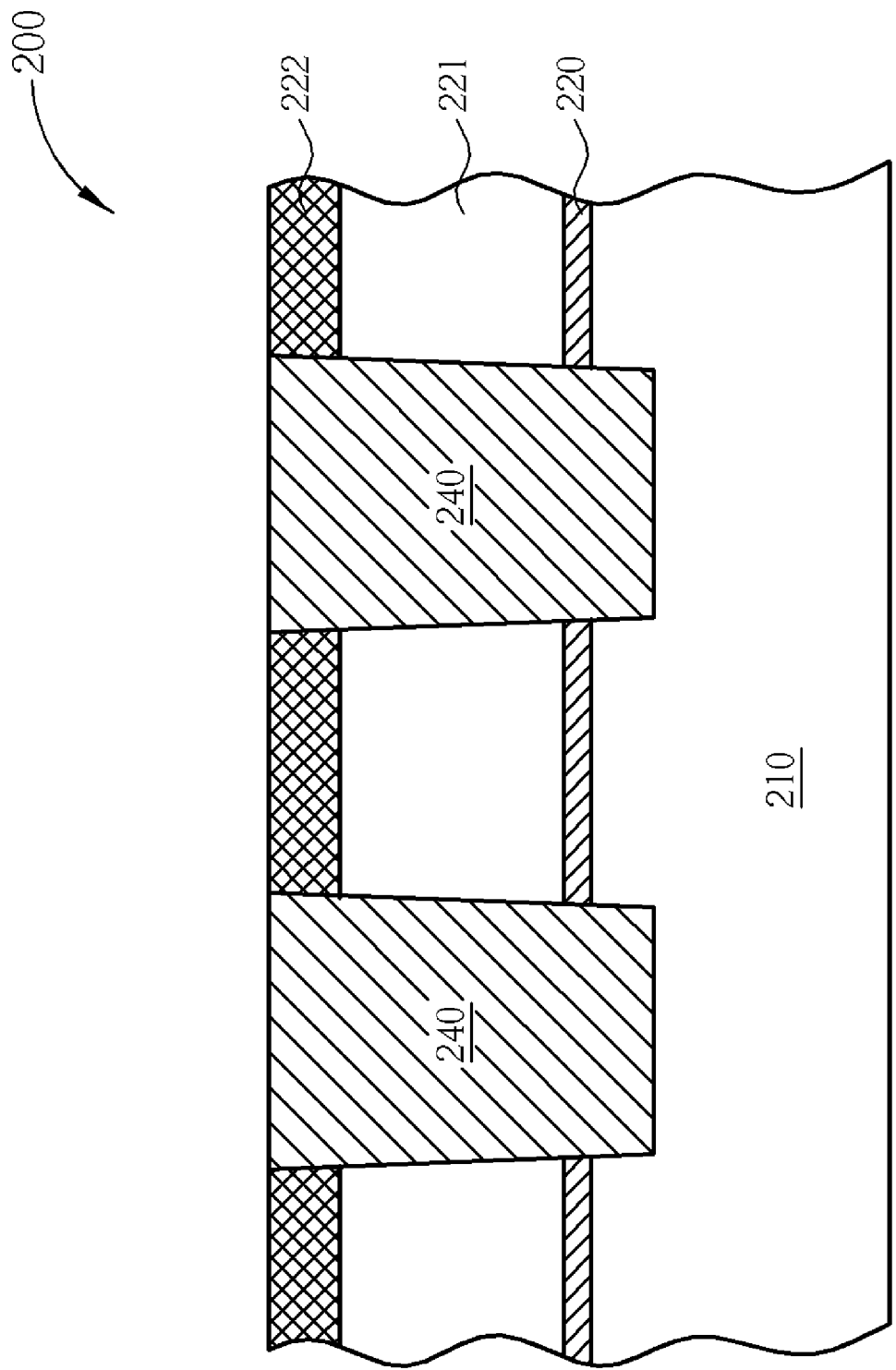

Referring to FIG. 3, the first trench 223 may be filled with a first oxide layer 240 by spin-on-glass in combination with high density plasma.

Optionally, a planarization procedure may be performed to planarize the first oxide layer 240 after the first oxide layer 240 is formed.

Figure 4:
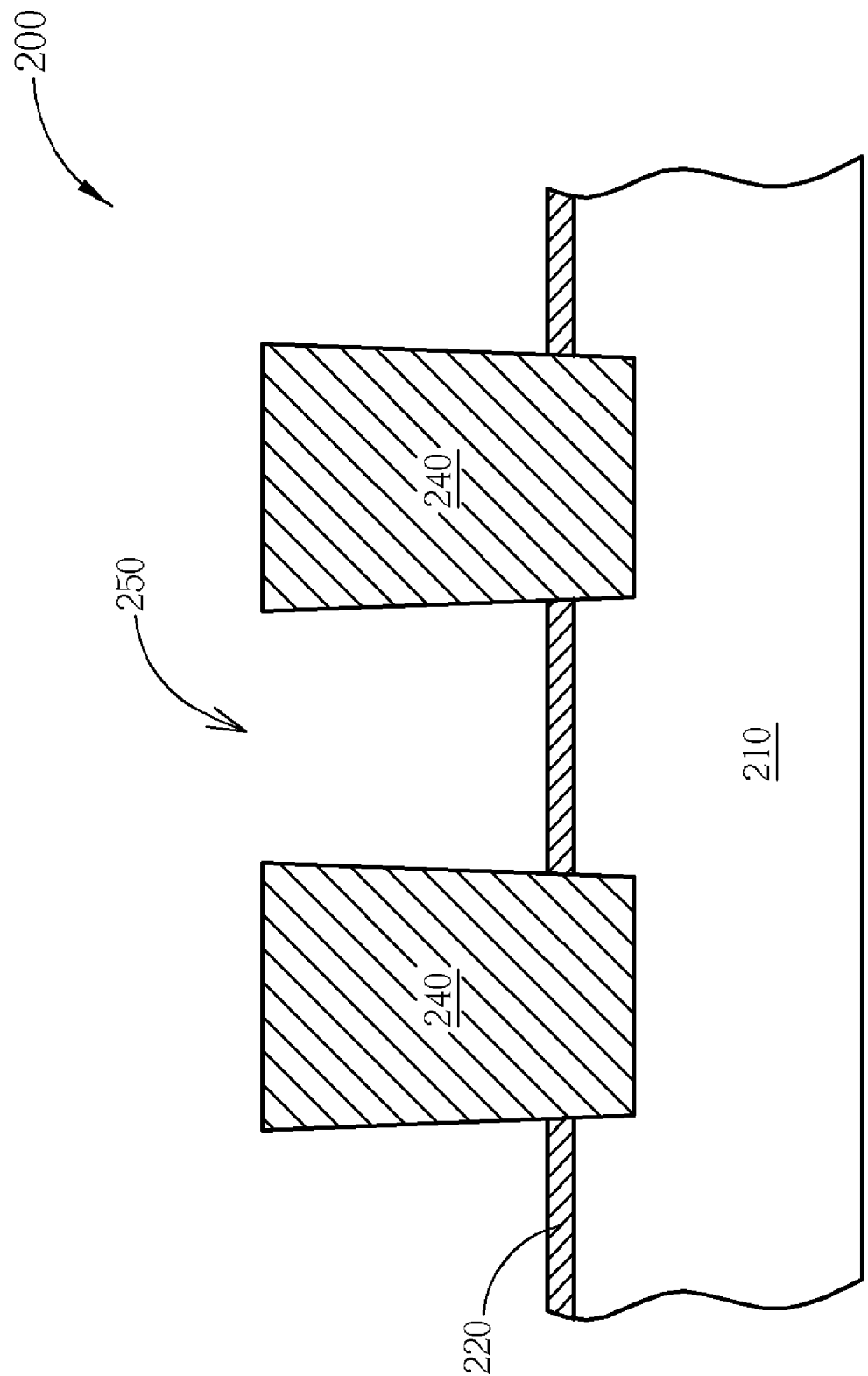

Referring to FIG. 4 as well as FIG. 3 for reference, the first hard mask 222 layer and the sacrificial poly-Si layer 221 are removed to form a second trench 250 designated for the floating gate and the sacrificial oxide layer 220 is exposed. The profile of the second trench 250 should be in a shape of a trapezoid due to the profile of the first oxide layer 240.

The sacrificial poly-Si layer 221 and the first hard mask layer 222 may be removed by a wet etching process. For example, if the first hard mask layer 222 includes silicon nitride, phosphoric acid may be used. The sacrificial poly-Si layer 221 may be removed by using a fluoro-containing solution or an alkaline solution. The fluoro-containing solution may be a buffered HF solution (BHF), and the alkaline solution may be ammonia or KOH solution.

Figure 5:
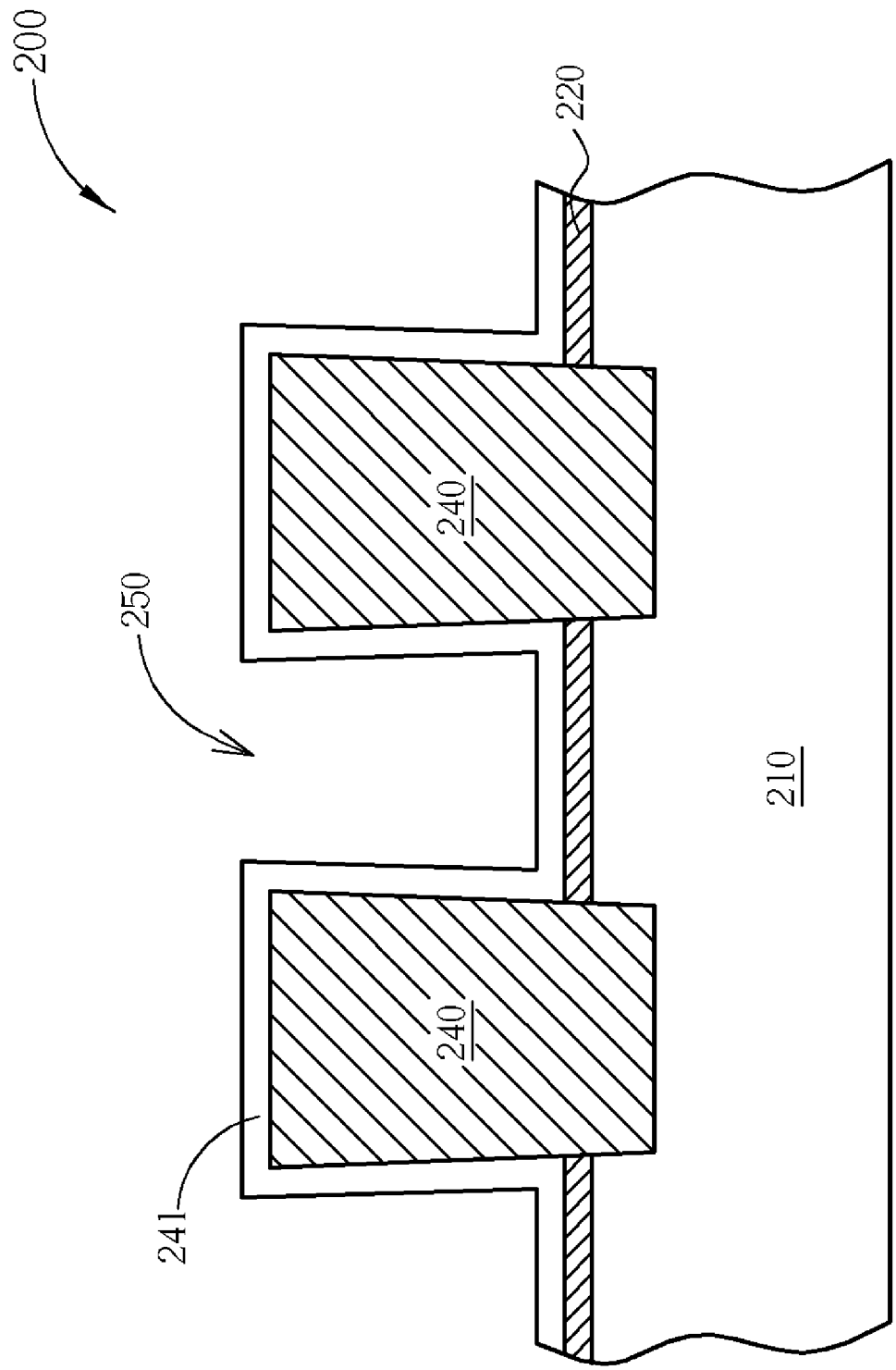

Referring to FIG. 5, a oxide layer 241 is conformally deposited on the sacrificial oxide layer 220 and the first oxide layer 240, by a low pressure chemical vapor deposition process or a plasma-enhanced chemical vapor deposition process for example, such that the oxide layer 241 has a thickness of about 200 Å-300 Å.

Figure 6:
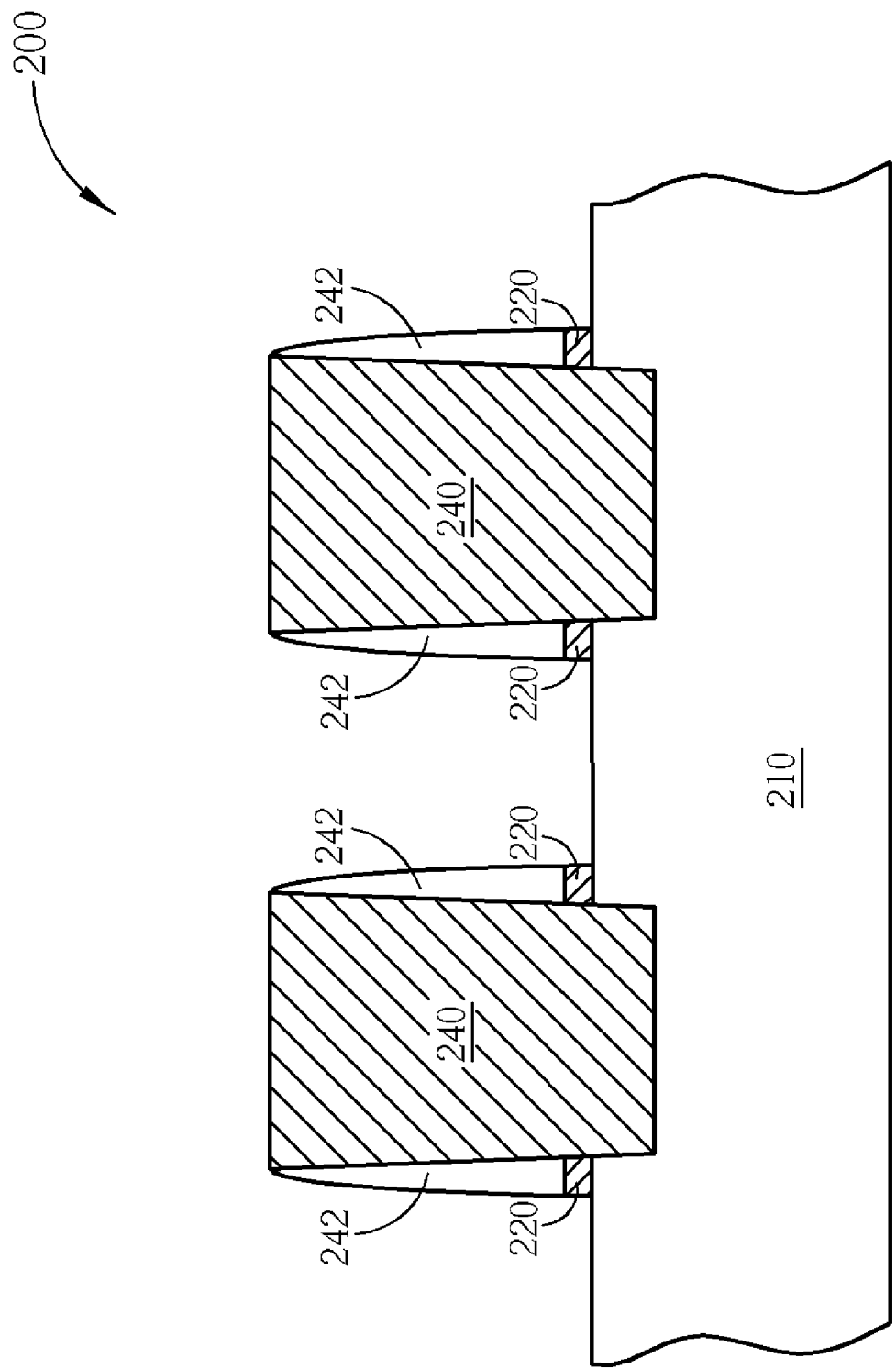

Referring to FIG. 6, the oxide layer 241 on the sacrificial oxide layer 220 and on the top of the first oxide layer 240 is removed to form a spacer as an STI oxide spacer 242 which surrounds the first oxide layer 240 to allow the spacer 242 to engage with the substrate 210 and to allow the second trench 250 to have an inverted trapezoidal shape. Meanwhile, a portion of the sacrificial oxide layer 220 is still remained to combine with the spacer. As the characteristic of the sacrificial oxide layer 220 is substantially the same as that of the spacer, the sacrificial oxide layer 220 may be considered as a part of the spacer. Simultaneously the substrate 210 is exposed. The spacer 242 also widens the base of the first oxide layer 240. Simultaneously the sacrificial oxide layer 220 is also removed. The oxide layer 241 and the sacrificial oxide layer 220 may be removed by a dry etching method.

Now the profile of the first oxide layer 240 is amended from an inverted trapezoid to a trapezoid due to the lateral compensation of the oxide layer 241. Since the remaining poly-Si would damage bits independence and distribution or cause data storage shortage, the problem of remaining poly-Si is solved by amending profile of the first oxide layer 240 from an inverted trapezoid to a trapezoid. This step is a pre-amendment of the profile of the floating gate poly-Si layer.

Figure 7:
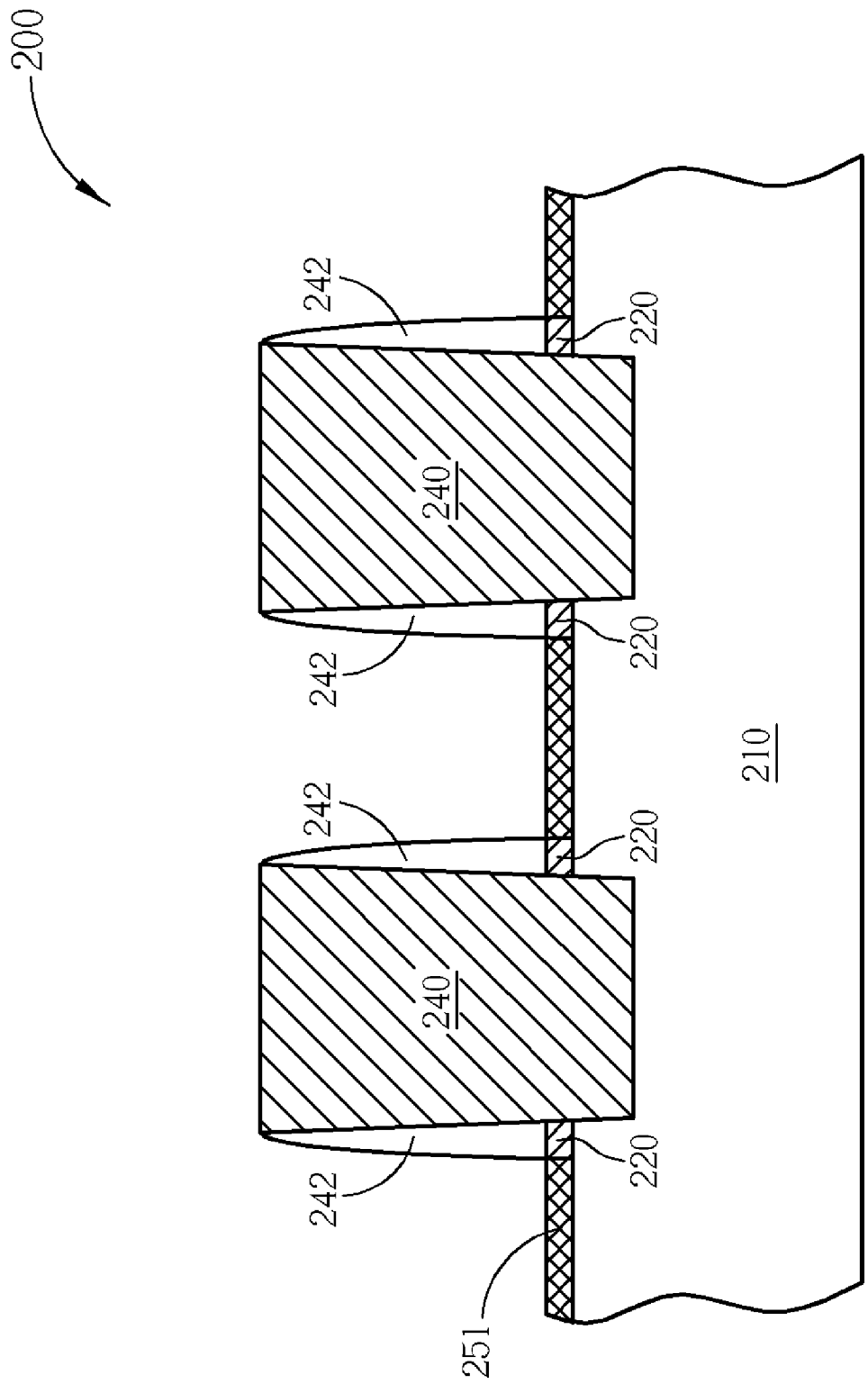

Referring to FIG. 7, now the flash memory 200 may be manufactured by the conventional method. For example, a floating gate oxide layer 251 of better quality may be formed on the substrate 210 and adjacent to the STI oxide spacer 242 after the STI oxide spacer 242 is formed to replace the sacrificial oxide layer 220 which covered the substrate 210. The floating gate oxide layer 251 may be formed by an atmospheric pressure (AP) furnace oxidation to have a thickness of about 70 Å-100 Å.

Figure 8:
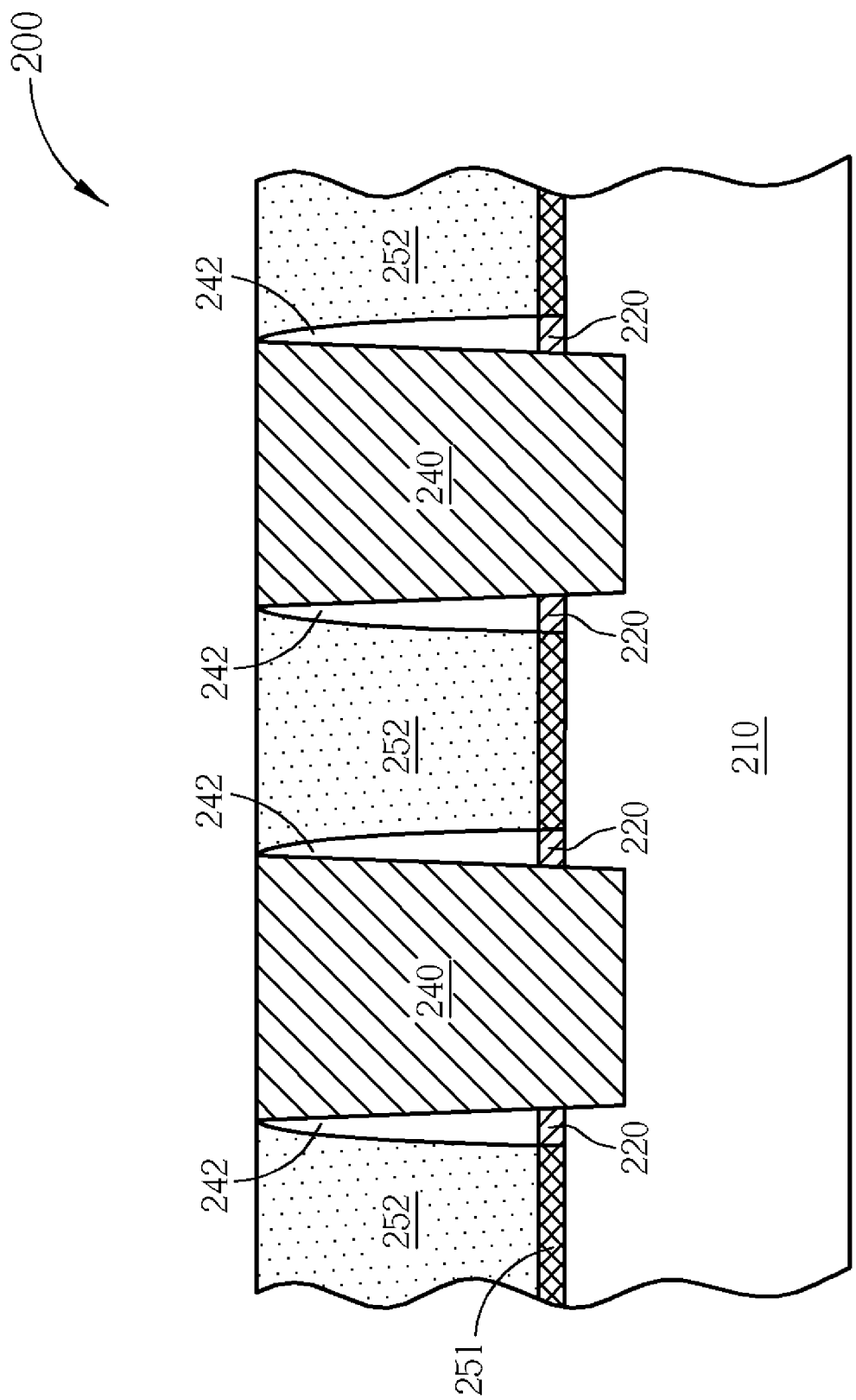

With reference to FIG. 8, the second trench 250 may be filled with the floating gate poly-Si layer 252 doped with N-dopant by such as in-situ implantation. Optionally, a planarization procedure may be performed to planarize the floating gate poly-Si layer 252.

Figure 9:
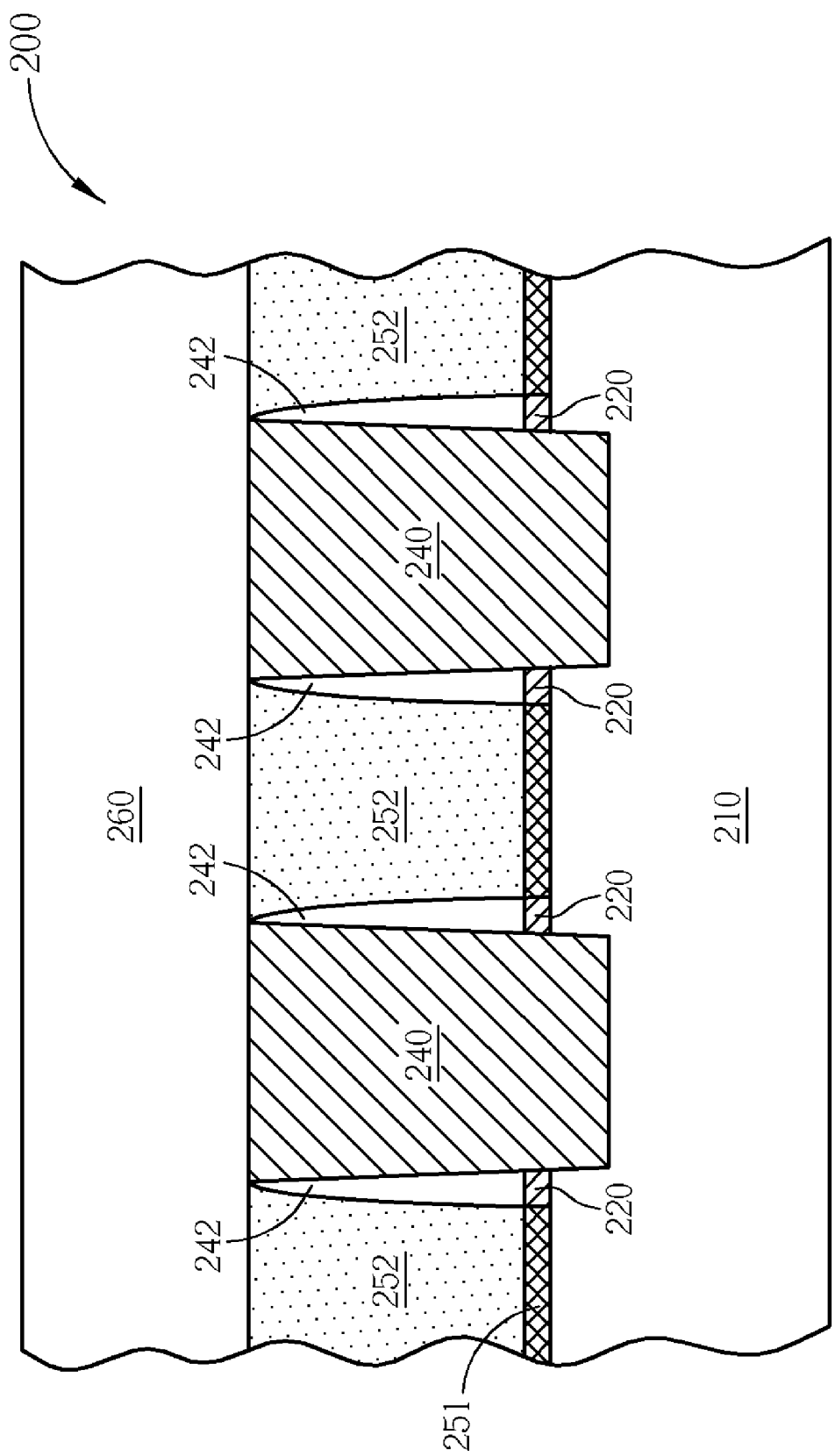

With reference to FIG. 9, a second hard mask layer 260 with a thickness about 1400 Å-2200 Å may be formed on the top of the first oxide layer 240 and on the floating gate poly-Si layer 252. The second hard mask layer 260 may be a silicon nitride layer.

After the second hard mask layer 260 is formed, the flash memory 200 may be made by the conventional method. For example, a composite dielectric structure such as a layer of oxide-nitride-oxide (ONO) which covers the second hard mask layer 260 and the floating gate poly-Si layer 252 is formed after the second hard mask layer 260, the first oxide layer 240 and the floating gate poly-Si layer 252 are etched. Later, the essential elements such as the control gate layer, the word lines, the interlayer dielectric layer or the source contact and the drain contact may be formed. The details will not be described.

Those skilled in the art will readily observe that numerous modifications and alterations of the device and method may be made while retaining the teachings of the invention.

What is claimed is:

1. A method for manufacturing a flash memory, comprising
   providing a substrate with a first sacrificial layer formed on said substrate, a second sacrificial layer formed on said first sacrificial layer, a first hard mask layer formed on said second sacrificial layer and a first trench exposing part of said substrate;
   filling said first trench with a first oxide layer;
   removing said first hard mask layer and said second sacrificial layer to form a second trench and expose said first sacrificial layer;
   forming a spacer as a STI oxide spacer surrounding said first oxide layer to allow the spacer to engage with the substrate and to allow the second trench to have an inverted trapezoidal shape;
   forming a floating gate oxide layer on said substrate;
   filling said second trench with a floating gate poly-Si layer; and
   forming a second hard mask layer on top of said first oxide layer and on said floating gate poly-Si layer.

2. The method for manufacturing a flash memory of claim 1, wherein forming said spacer further comprising:
   depositing an oxide layer conformally on said first sacrificial layer and said first oxide layer; and
   removing said oxide layer on said first sacrificial oxide layer and on the top of said first oxide layer and said first sacrificial layer and exposing part of said substrate.

3. The method for manufacturing a flash memory of claim 1, wherein said spacer widens the base of said first oxide layer.

4. The method for manufacturing a flash memory of claim 1, wherein a portion of said spacer is composed of a portion of said first sacrificial layer.

5. The method for manufacturing a flash memory of claim 4, wherein said oxide layer has a thickness of about 200 Å-300 Å.

6. The method for manufacturing a flash memory of claim 1, wherein removing said oxide layer is carried out by a dry etching.

7. The method for manufacturing a flash memory of claim 5, wherein said first trench exposes a depth of about 1800 Å-2600 Å of said substrate.

8. The method for manufacturing a flash memory of claim 7, wherein said floating gate oxide layer has a thickness of about 70 Å-100 Å.

9. The method for manufacturing a flash memory of claim 1, wherein said first hard mask comprises silicon nitride.

* * * * *